United States Patent
Yang

(10) Patent No.: US 7,633,225 B2
(45) Date of Patent: Dec. 15, 2009

(54) LED ELEMENT FOR AN LED STREAM

(76) Inventor: Chen-Sheng Yang, No. 10, Lane 233, Lanchang Rd., Nanzih District, Kaohsiung (TW)

(*) Notice: Subject to any disclaimer, the term of this patent is extended or adjusted under 35 U.S.C. 154(b) by 350 days.

(21) Appl. No.: 11/739,770

(22) Filed: Apr. 25, 2007

(65) Prior Publication Data

US 2008/0265270 A1 Oct. 30, 2008

(51) Int. Cl.
*H05B 33/00* (2006.01)
*F21V 33/00* (2006.01)
*H01R 24/00* (2006.01)

(52) U.S. Cl. ............ 313/512; 313/318.05; 313/318.09; 362/612; 362/800

(58) Field of Classification Search ........................ None
See application file for complete search history.

(56) References Cited

U.S. PATENT DOCUMENTS

| 6,224,238 B1* | 5/2001 | Chen ........................... 362/654 |
| 6,794,817 B2* | 9/2004 | Ueda ........................... 313/512 |
| 6,841,933 B2* | 1/2005 | Yamanaka et al. .......... 313/512 |
| 7,094,111 B1* | 8/2006 | Qingbiao ................. 439/699.2 |
| 2001/0026447 A1* | 10/2001 | Herrera ....................... 362/226 |
| 2002/0093815 A1* | 7/2002 | Ou .............................. 362/109 |

* cited by examiner

*Primary Examiner*—Ashok Patel
(74) *Attorney, Agent, or Firm*—Rabin & Berdo, P.C.

(57) ABSTRACT

An LED element of an LED stream has an LED and a hollow seat for holding the LED. The LED has a body and two pins extended from a bottom face of the body. The hollow seat has two opposite through side holes defined in an outside of the hollow seat. To assemble the LED element, the LED with the two pins upwardly plugs to inside of the hollow seat. Then the two pins respectively and outwardly pass through the corresponding through side hole of the seat until the body is held by an upper portion of the hollow seat.

2 Claims, 7 Drawing Sheets

LED ELEMENT FOR AN LED STREAM

BACKGROUND OF THE INVENTION

1. Field of the Invention

The present invention relates to an LED element, and more particularly to an LED element for an LED stream.

2. Description of Related Art

An LED stream includes multiple LED elements. The LED elements are connected in serial by one wire. With reference to FIG. 4, an exploded perspective view of one LED element for the LED stream is shown. The LED element has an LED (50) and a seat (60). The LED (50) has a body (51) and two pins (52, 53) downwardly extended from a bottom of the body (51). With further reference to FIG. 5, the seat (60) has a cylinder upper portion (61) and a rectangular lower portion (62). An upper chamber (611) is defined in the upper portion (61) of the seat (60) and a lower chamber (621) is defined in the lower portion (62) of the seat (60). The upper chamber (611) communicates with the lower chamber (621). In addition, an upper opening (612) is defined on top of the upper portion (61) and communicates with the upper chamber (611). Two opposite lower slots (622, 623) are defined on the bottom of the lower portion (62) and communicate with the lower chamber (621).

To assemble the LED element, glue is provided on the periphery of the upper portion (21). The two pins (52, 53) of the LED (50) downwardly plug into the seat (60) through the upper opening (612), the upper chamber (611) and the lower chamber (621) and then respectively pass through the corresponding slot (622, 623). The LED (50) is mounted on the periphery of the upper portion (61) of the seat (60). With reference to FIGS. 6 and 7, the two pins (52, 53) are cut and then respectively and outwardly bent to be against the corresponding outside of the lower portion (62) of the seat (60). With reference to FIG. 7, the two pin segments (521, 531) against the outside of the seat (60) are used to electronically connect to the wire of the LED stream.

Based on the foregoing description, a conventional process of manufacturing the conventional LED element has steps of preparing a seat and an LED, supplying glue, cutting pins and bending pins. However, if the number of steps of the manufacturing process can be reduced, the amount of the LED element for the LED stream is increased effectively.

SUMMARY OF THE INVENTION

The main objective of the present invention is to provide an LED element that is used to be a light source of an LED stream.

The LED element for the LED stream has an LED element of an LED stream has an LED and a hollow seat for holding the LED. The LED has a body and two pins extended from a bottom face of the body. The hollow seat has two opposite through side holes defined in an outside of the hollow seat. To assembly the LED element, the LED with the two pins upwardly plugs to inside of the hollow seat. Then the two pins of the LED respectively and outwardly pass through the corresponding through side hole of the seat until the body is held by an upper portion of the hollow seat.

Based on the foregoing description, since the two opposite through side holes are defined through the outside of the hollow seat, the two pins of the LED directly pass through outside of the hollow seat without bending step. Therefore, manufacturing steps can be further simplified.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
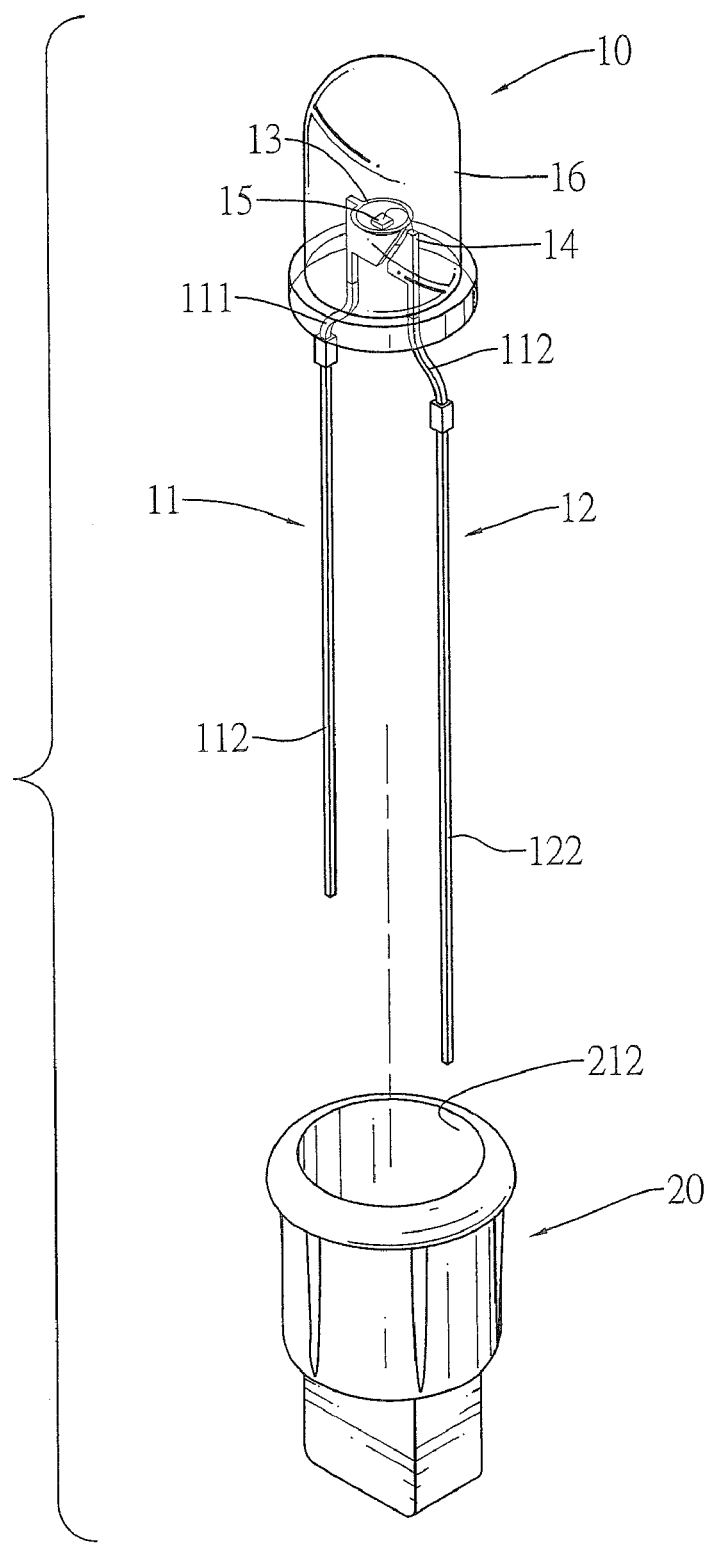
FIG. 1 is an exploded perspective view of an LED element in accordance with the present invention.

With reference to FIG. 1, a preferred embodiment of an LED element for an LED stream has an LED (10) and a hollow seat (20). The LED (10) has a body and two pins (11, 12). An upper segment (111) close to a bottom face of the body is curved so the each pin (11, 12) has a curved upper segment (111, 121) and a lower segment (112, 122).

Figure 2:
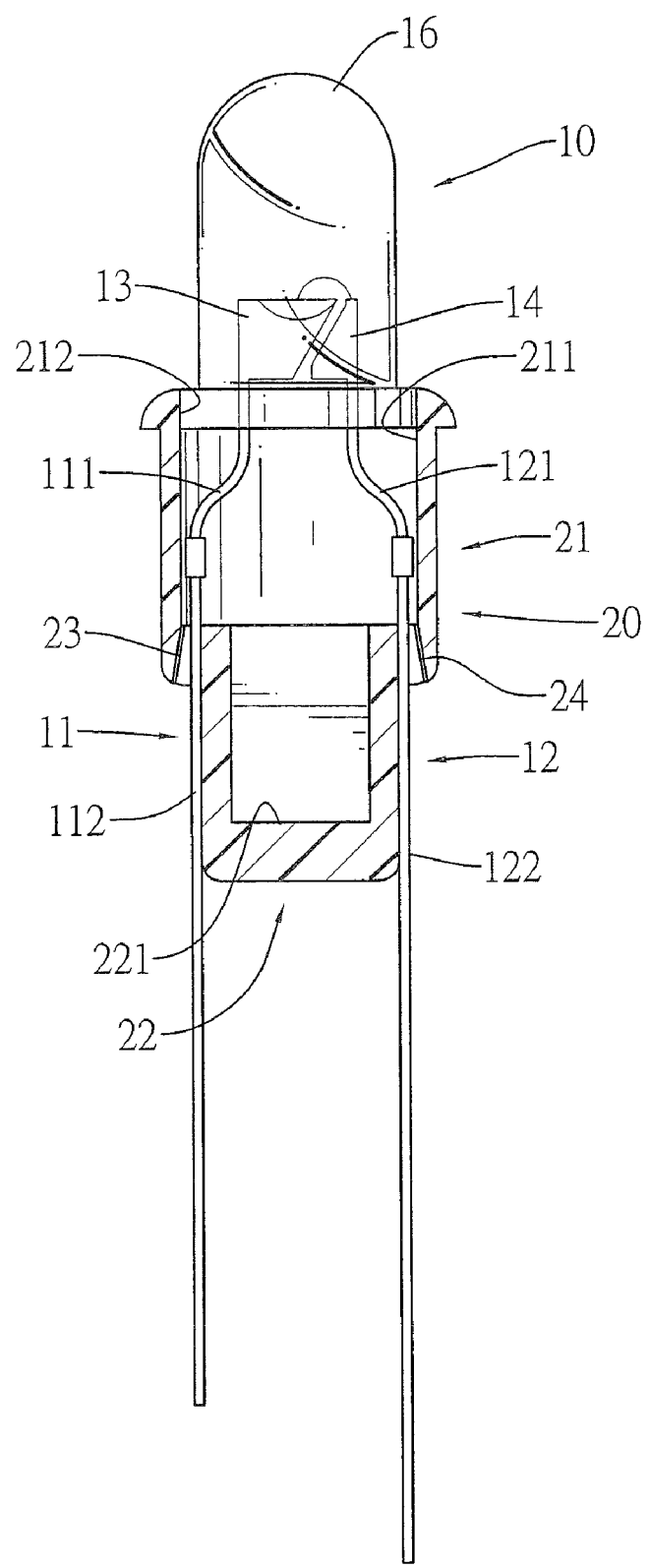
FIG. 2 is a cross sectional view of the LED element in accordance with the present invention.

With further reference to FIG. 2, the hollow seat (20) has an outside and two opposite through side holes (23, 24) are defined on the outside, The body of the LED (10) is held by the hollow seat (20). The two pins (11,12) are passed through the two opposite through side holes (23, 24), so the lower segments (112, 122) are respectively against on the outside of the seat (20).

In this preferred embodiment, the hollow seat (20) has a cylinder upper portion (21) and a rectangular lower portion (22). The two opposite through side holes (23, 24) are defined in a joint of the cylinder upper portion (21) and a rectangular lower portion (22). Further, an upper chamber (211) is defined in the upper portion (21) of the seat (20) and a lower chamber (221) is defined in the lower portion (22) of the seat (20). An opening (212) is defined on the top face of the cylinder upper portion (21) and communicates with the upper chamber (211). The upper chamber (211) communicates with the lower chamber (221) and fits for size of the body of the LED (10). The upper chamber (211) further communicates with the two opposite through side holes (23, 24). Since a diameter of the cylinder upper portion (21) is larger than a width of the lower portion (22), the two opposite through side holes (23, 24) are defined on a bottom of the cylinder upper portion (21) close to the rectangular lower portion (22). Therefore, the two through side holes (23, 24) are faced to the outside of the rectangular lower portion (22).

Figure 3:
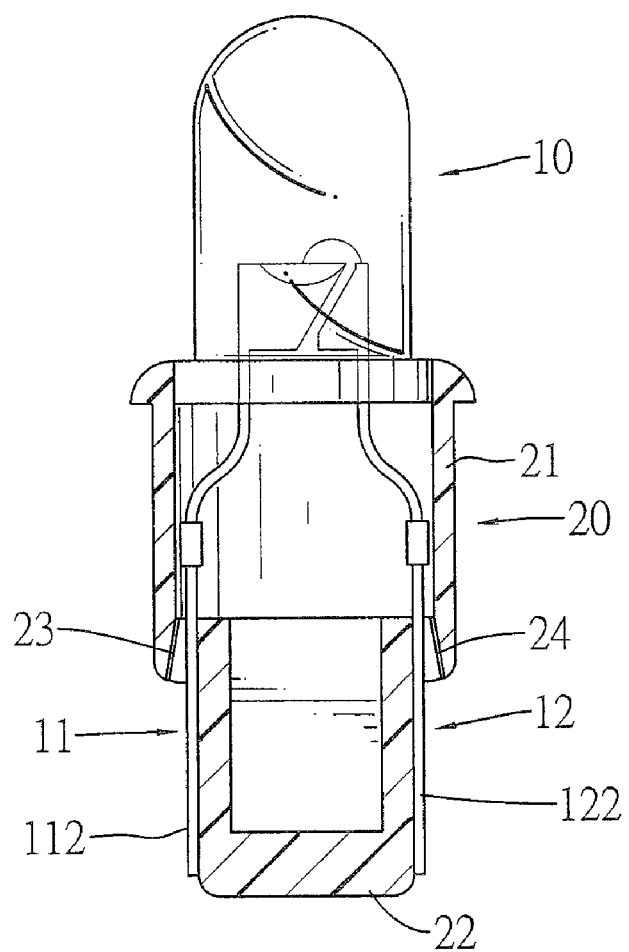
FIG. 3 is another cross sectional view of the LED element in accordance with the present invention.
Figure 4:
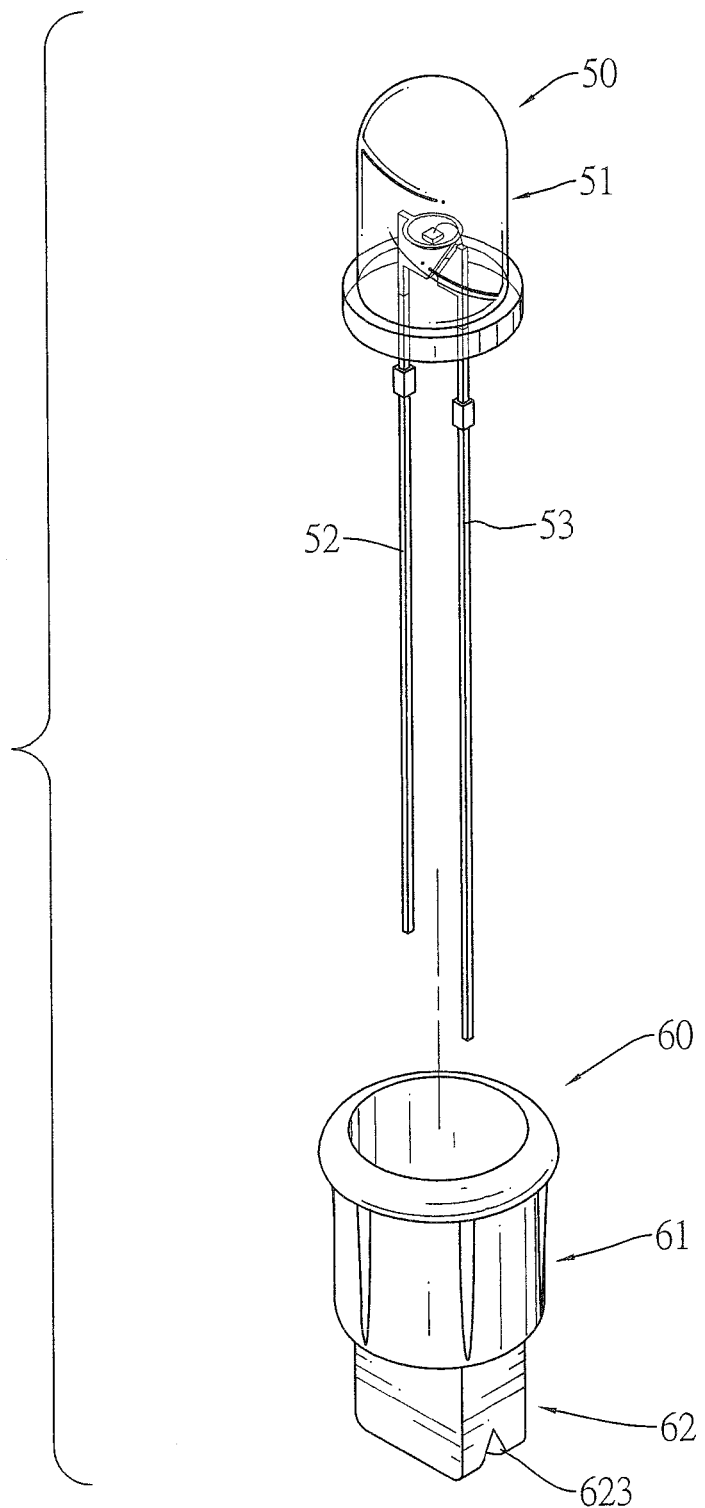
FIG. 4 is an exploded perspective view of a conventional LED element in accordance with the prior art.
Figure 5:
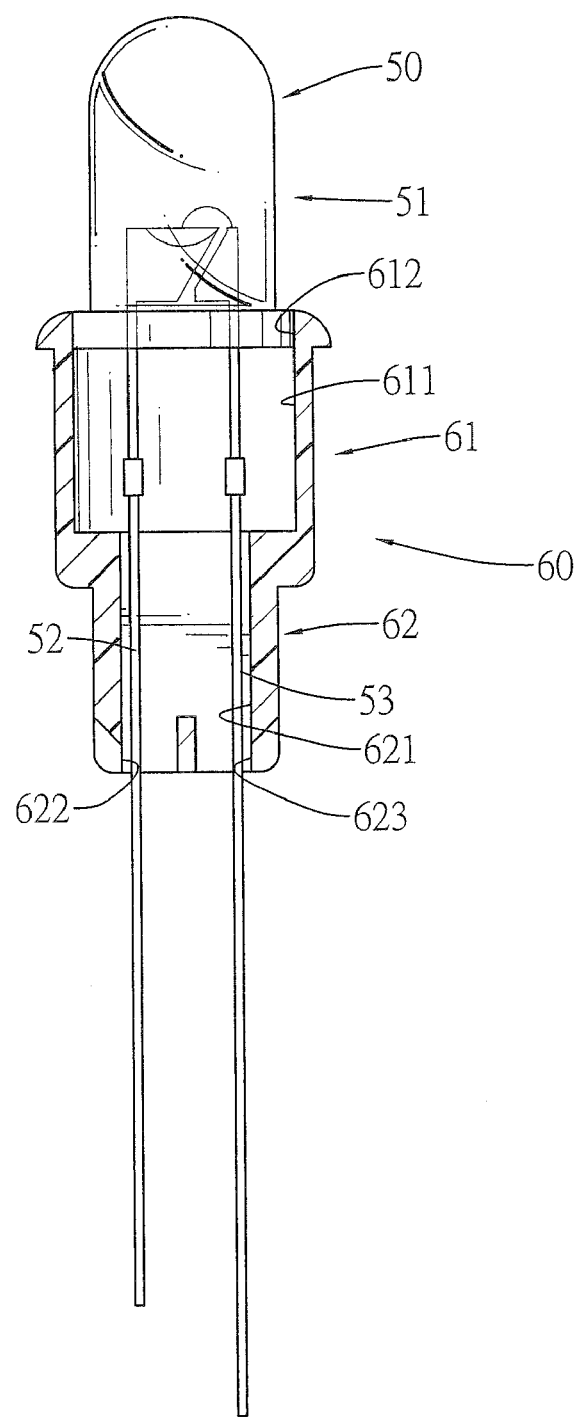
FIG. 5 is a cross sectional view in partial of the conventional LED element in accordance with the prior art.
Figure 6:
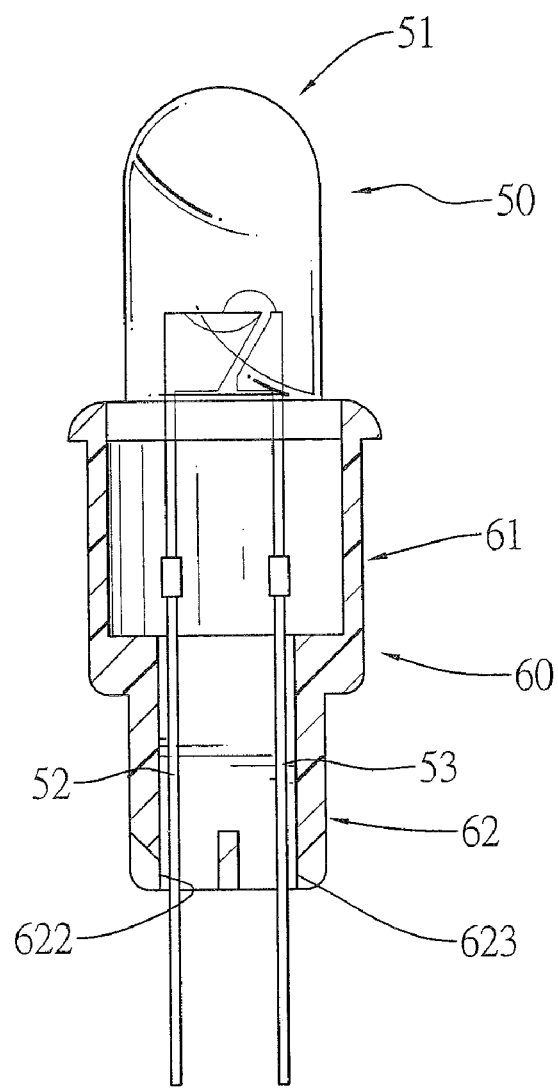
FIG. 6 is another cross sectional view in partial of the conventional LED element in accordance with the prior art.
Figure 7:
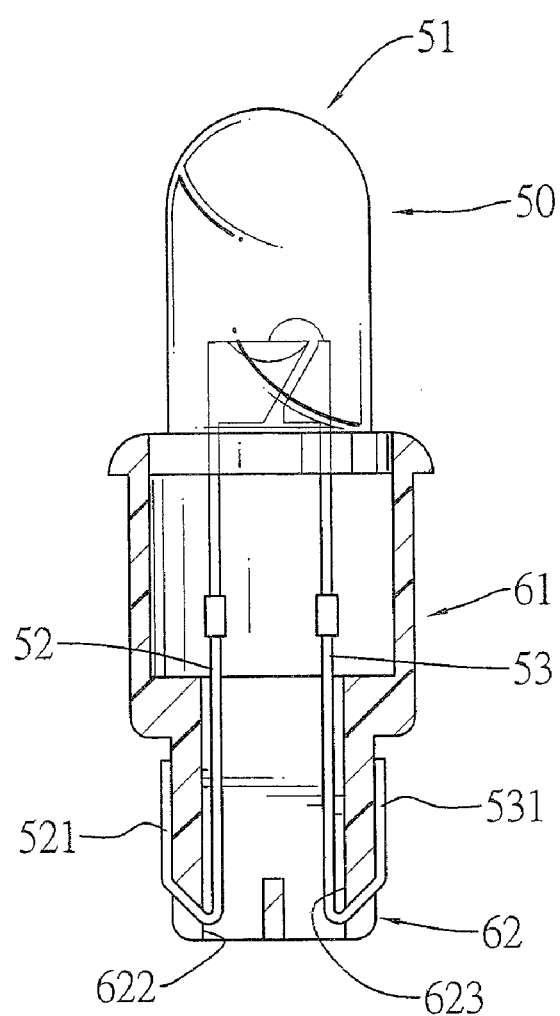
FIG. 7 is another cross sectional view in partial of the conventional LED element in accordance with the prior art.

To assemble the LED element of the present invention, glue may be provided on a periphery of the cylinder upper portion (21). The two pins (11, 12) of the LED (10) downwardly plug into inside of the hollow seat (20) through opening (212) and the upper chamber (211) and then respectively and outwardly pass through the corresponding through side hole (23, 24) on the outside of the seat (20). The upper curved segments (111, 121) are retained inside of the upper portion (21). The lower segments (112, 122) of the two pins (11,12)

are against the outside of the lower portion (22) directly without bending step. With reference to FIG. 3, the two lower segments (112, 122) of the two pins (11,12) are further partially cut to fit for a length of the seat (20).

Based on the foregoing description, the two through side holes are defined on an outside of the seat and the two pins of the LED are passed through the seat and then against the outside of the seat for connecting to a wire of the LED stream. Therefore, after the body of the LED is held by the seat, only a cutting step is required.

According to the above configuration of the LED element, with reference to FIGS. 1 and 2, the hollow seat (20) can be used in manufacturing body of the LED (10). The body has an LED chip (15), a die pad (13) extended from a top of one pin (11), an electrode pad (14) extended from a top of the other pin (12) and an encapsulation (16). The LED chip (15) is mounted on the die pad (13) and then wire bonded to the electrode pad (14). After the wire bonding step, the two pins (11, 12) with the LED chip (15) are inserted into the two through side holes (23, 24) of the hollow seat (20). The encapsulation (16) is formed among the die pad (23) with the LED chip (15), the electrode pad (14) and the inside of the upper portion (21). Therefore, during manufacturing the LED element, a supplying glue step for mounting the body in the seat is omitted.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An LED element for a LED stream, comprising:
    an LED having a body, and two pins extended from a bottom face of the body; and
    a hollow seat having:
        a cylindrical upper portion having a diameter, and an upper chamber defined therein;
        a rectangular lower portion having a width, and a lower chamber communicating with the upper chamber, the diameter of the cylindrical upper portion being larger than the width of the rectangular lower portion;
        a joint defined between the cylindrical upper portion and the rectangular lower portion; and
        two opposite through side holes formed at the joint and which communicate an inside of the hollow seat with an outside of the hollow seat;
    wherein the body is held in the hollow seat and the respective two pins of the LED outwardly pass through the corresponding through side holes from the inside of the hollow seat to abut against the outside of the hollow seat.

2. The LED element as claimed in claim 1, wherein each pin comprises:
    an upper curved segment close to the bottom face of the body and retained inside of the hollow seat; and
    a lower segment passing through the corresponding through side hole and abutting against the outside of the hollow seat.

* * * * *